(12) United States Patent
Lin et al.

(10) Patent No.: US 6,969,807 B1
(45) Date of Patent: Nov. 29, 2005

(54) PLANAR TYPE FLEXIBLE CABLE WITH SHIELDING STRUCTURE

(75) Inventors: Gwun-Jin Lin, Taoyuan (TW); Chi-Kuang Hwang, Toayuan (TW); Ching-Cheng Tien, Toayuan (TW)

(73) Assignee: Advanced Flexible Circuits Co., Ltd., Toayuan (TW)

( * ) Notice: Subject to any disclaimer, the term of this patent is extended or adjusted under 35 U.S.C. 154(b) by 0 days.

(21) Appl. No.: 10/894,006

(22) Filed: Jul. 20, 2004

(51) Int. Cl.$^7$ .................................................. H01B 7/08
(52) U.S. Cl. ..................................... 174/117 F; 174/36
(58) Field of Search ............................. 174/36, 110 R, 174/113 R, 117 F, 117 FF

(56) References Cited

U.S. PATENT DOCUMENTS

| | | | | |
|---|---|---|---|---|
| 3,173,991 A | * | 3/1965 | Breakfield, Sr. | ........ 174/117 FF |
| 3,179,904 A | * | 4/1965 | Paulsen | ......................... 174/36 |
| 3,612,743 A | * | 10/1971 | Angele et al. | ................. 174/36 |
| 3,612,744 A | * | 10/1971 | Thomas | ......................... 174/36 |
| 3,735,022 A | * | 5/1973 | Estep | ...................... 174/117 F |
| 4,468,089 A | * | 8/1984 | Brorein | .................. 174/117 F |
| 5,084,594 A | * | 1/1992 | Cady et al. | ...................... 174/36 |
| 5,371,324 A | * | 12/1994 | Kanno et al. | .............. 174/117 F |
| 5,552,565 A | * | 9/1996 | Cartier et al. | ............. 174/117 F |
| 5,847,322 A | * | 12/1998 | Sakai et al. | .............. 174/110 R |
| 6,538,205 B2 | * | 3/2003 | Ueno | ....................... 174/117 F |
| 6,677,518 B2 | * | 1/2004 | Hirakawa et al. | .............. 174/36 |
| 6,689,958 B1 | * | 2/2004 | McKenney et al. | ..... 174/117 FF |

* cited by examiner

Primary Examiner—Dean A. Reichard
Assistant Examiner—Adolfo Nino
(74) Attorney, Agent, or Firm—Rosenberg, Klein & Lee

(57) ABSTRACT

A planar type flexible cable includes a longitudinally extended insulated section, and at least one pair of differential-mode signal transmission lines horizontally closely spaced inside the insulated section in a transverse direction, and extended in an extending direction of the insulated section from a first to a second end of the insulated section. A flat layer of shielding structure is provided on at least one surface of the insulated section to provide an impedance value needed by the differential-mode signal transmission lines. The flat layer of shielding structure includes a net-type shielding structure with a plurality of openings. A plurality of the insulated sections is vertically stacked with each insulated section having at least one pair of the differential-mode signal transmission lines provided therein and a flat layer of shielding structure provided on one surface thereof.

6 Claims, 5 Drawing Sheets

PLANAR TYPE FLEXIBLE CABLE WITH SHIELDING STRUCTURE

BACKGROUND OF THE INVENTION

1. Field of the Invention

The present invention relates to a flexible cable, and more particularly to a planar type flexible cable with shielding structure.

2. Description of the Prior Art

Connecting lines, signal cables, and flat cables are frequently used in circuit design of various electric apparatus, such as computers, measuring instruments, and control devices, so as to electrically connect among different circuit boards, circuit modules, or more than two electric apparatus to one another.

Taking the currently widely adopted notebook computer as an example, the computer is electrically connected to the liquid crystal display (LCD) screen mainly with flat connecting cables. Signal contacts at two ends of the flat connecting cable are separately connected to signal connecting terminals of the notebook computer and of the LCD screen.

In the logic circuit design for high-speed signal transmission, it is a common practice to transmit data at high speed using differential-mode signal transmission lines with shielding structure. It is possible the signal transmission lines are provided to transmit common-mode signals, in addition to the differential-mode signals. A typical differential mode signal transmission line needs an impedance value of 100 ohms, and a typical common-mode signal transmission line needs an impedance value of 100 ohms, too.

Moreover, for the flat cable to extend between two different circuit boards, circuit modules, or electric apparatus, it is conventionally required to pre-form a channel for the flat flexible cable to extend therethrough. However, in some application fields, only a round or a square channel could be formed. Such round or square channel does not allow the conventional flat cable to pass therethrough. As an alternative, the circuit designer could only use a coaxial cable to connect two different electric apparatus to each other. However, the coaxial cable does not provide a flexibility as good as the flat flexible cable. Therefore, there are many limitations in designing circuits.

It is therefore an important issue in the logic circuit for high-speed signal transmission to develop a differential-mode signal transmitting structure with good signal shielding effect, and to provide a flat layer of shielding structure that provides an impedance value needed by the differential-mode signal transmission line. And, it would be more practical to develop a planar type flexible cable with shielding structure that includes a plurality of vertically stacked insulated sections.

SUMMARY OF THE INVENTION

A primary object of the present invention is to provide a planar type flexible cable with shielding structure. The flexible cable includes an extended insulated section and at least one pair of differential-mode signal transmission lines provided inside the insulated section. Whereby when a high-speed signal is transmitted via the differential-mode signal transmission lines, good signal shielding effect may be obtained.

Another object of the present invention is to provide a planar type flexible cable with a plurality of vertically stacked insulated sections, each of which has at least one pair of differential-mode signal transmission lines arranged therein, and a flat layer of shielding structure provided on one surface of each of the insulated sections.

To achieve the above object, in accordance with the present invention, there is provided a planar type flexible cable which includes a longitudinally extended insulated section, and at least one pair of differential-mode signal transmission lines horizontally closely spaced inside the insulated section in a transverse direction and extended in an extending direction of the insulated section from a first to a second end of the insulated section. A flat layer of shielding structure is provided on at least one surface of the insulated section to provide an impedance value needed by the differential-mode signal transmission lines. The flat layer of shielding structure may be a net-type shielding structure, or provided with a plurality of openings. A plurality of the insulated sections may be vertically stacked with each insulated section having at least one pair of the differential-mode signal transmission lines provided therein and a flat layer of shielding structure provided on one surface thereof.

With the planar type flexible cable with shielding structure according to the present invention, the differential-mode signal transmission lines have good signal shielding effect. Meanwhile, since the flat layer of shielding structure is spaced from the differential-mode signal transmission lines by a predetermined distance, it also provides the required impedance value needed by the differential-mode signal transmission lines during transmitting differential-mode signals.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
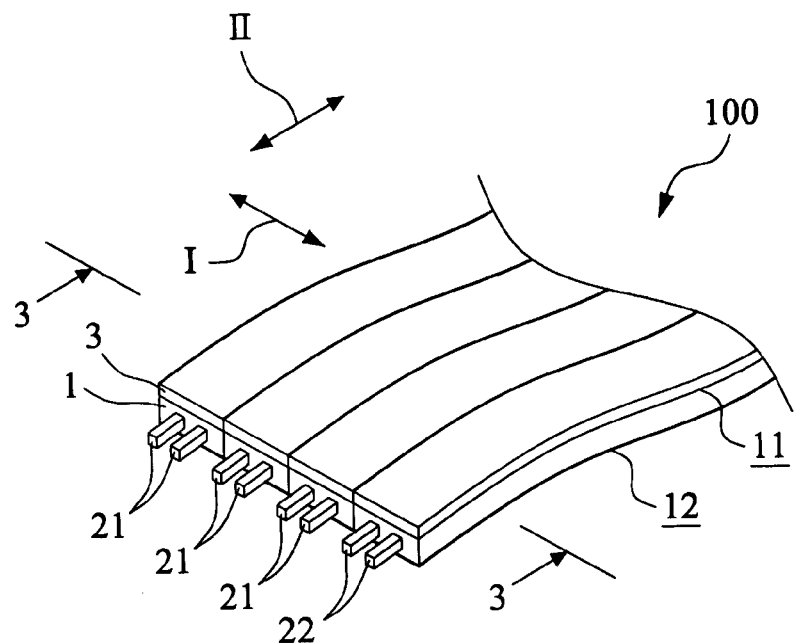
FIG. 1 is a fragmentary perspective view of a planar type flexible cable with shielding structure according to a first embodiment of the present invention.
Figure 2:
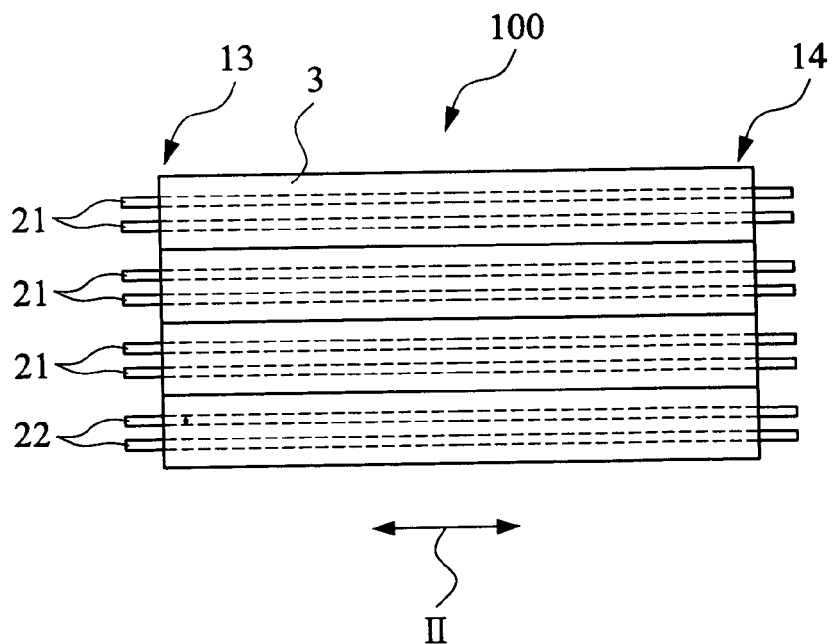
FIG. 2 is a top plan view of FIG. 1.
Figure 3:
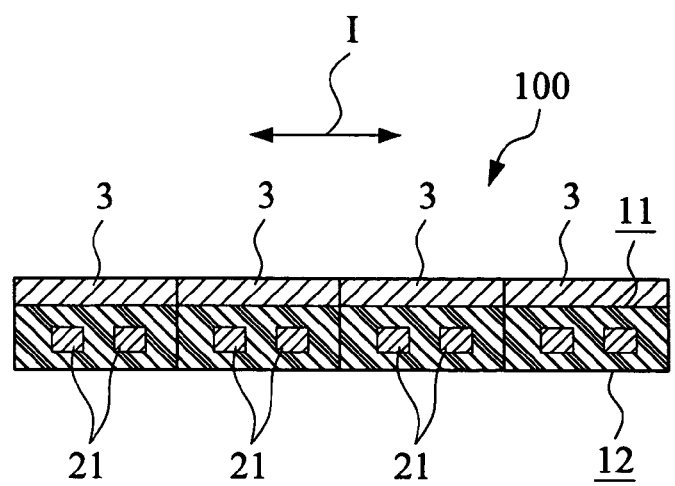
FIG. 3 is a sectional view taken along line 3—3 of FIG. 1.

Please refer to FIGS. 1 and 2 that are fragmentary perspective and top plan views, respectively, of a planar type flexible cable with shielding structure according to a first embodiment of the present invention, and to FIG. 3 that is a sectional view taken along line 3—3 of FIG. 1.

As shown, the planar type flexible cable with shielding structure according to the first embodiment of the present invention is generally denoted by a reference numeral 100, and mainly includes a longitudinally extended insulated section 1 having a top, or a first surface 11, and a bottom, or a second surface 12. And, two ends of the insulated section 1 are separately defined as a first end 13 and a second end 14.

At least one pair of differential-mode signal transmission lines 21 is arranged inside the insulated section 1. The two differential-mode signal transmission lines 21 in each pair are parallel with the first surface 11 of the insulated section 1 and horizontally closely spaced in a transverse direction 1 as indicated in FIGS. 1 and 3. Moreover, the differential-mode signal transmission lines 21 are extended in an extending direction II of the insulated section 1 from the first end 13 to the second end 14 of the insulated section 1.

In addition to the differential-mode signal transmission lines 21, it is also possible to simultaneously provide a pair of common-mode signal transmission lines 22 inside the insulated section 1, depending on different application fields.

A flat layer of shielding structure 3 is formed on the first surface 11 of the insulated section 1 with a predetermined distance left between the shielding structure 3 and the differential-mode signal transmission lines 21. The flat layer of shielding structure 3 not only serves as a shielding surface of the differential-mode signal transmission lines 21, but also provides an impedance value needed by the differential-mode signal transmission lines 21.

Figure 4:
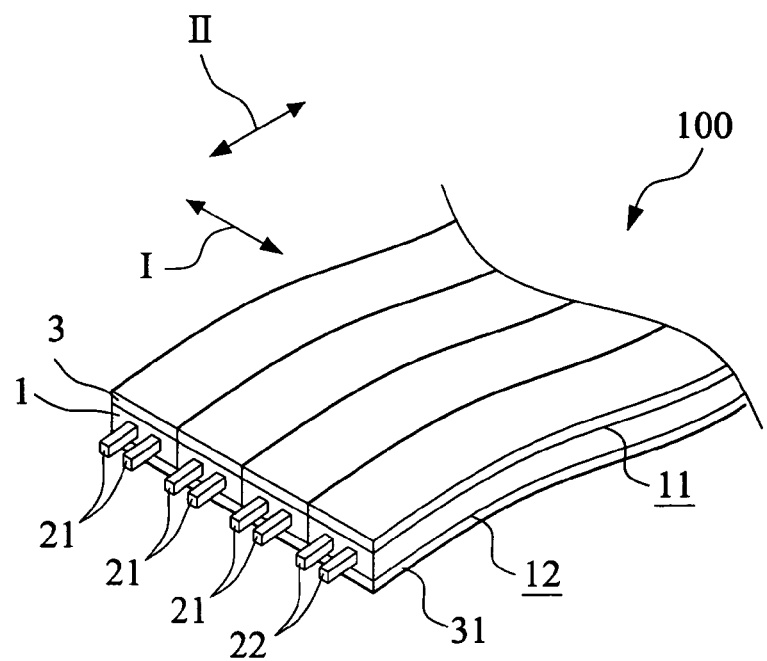
FIG. 4 is a fragmentary perspective view of a planar type flexible cable with shielding structure according to a second embodiment of the present invention.

FIG. 4 is a fragmentary perspective view of a planar type flexible cable with shielding structure according to a second embodiment of the present invention. The second embodiment is generally structurally similar to the first embodiment shown in FIG. 1, except that another flat layer of shielding structure 31 is formed on the second (bottom) surface 12 of the insulated section 1 in addition to the flat layer of shielding structure 3 formed on the first (top) surface 11 of the insulated section 1.

Figure 5:
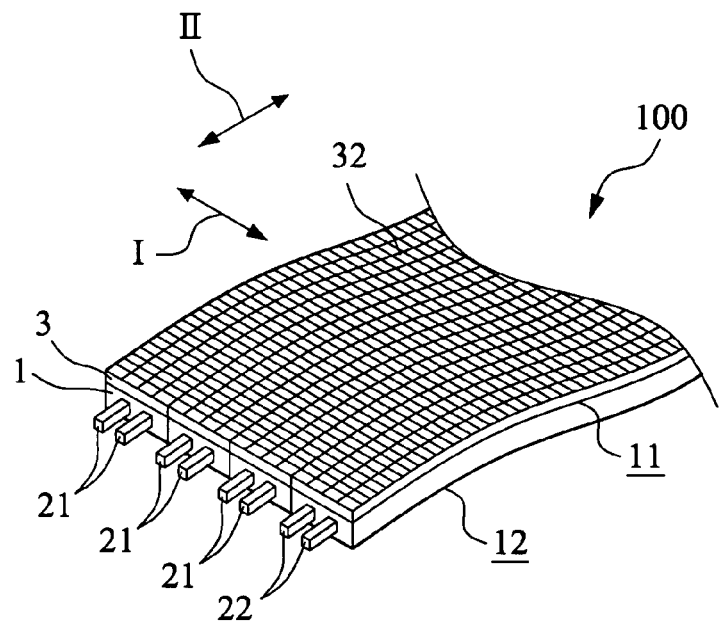
FIG. 5 is a fragmentary perspective view of a planar type flexible cable with shielding structure according to a third embodiment of the present invention.

FIG. 5 is a fragmentary perspective view of a planar type flexible cable with shielding structure according to a third embodiment of the present invention. The third embodiment is generally structurally similar to the first embodiment shown in FIG. 1, except that the flat layer of shielding structure formed on the first (top) surface 11 of the insulated section 1 is a flat layer of net-type shielding structure 32, which also serves as a shielding surface of the differential-mode signal transmission lines 21, and provides an impedance value needed by the differential-mode signal transmission lines 21.

Figure 6:
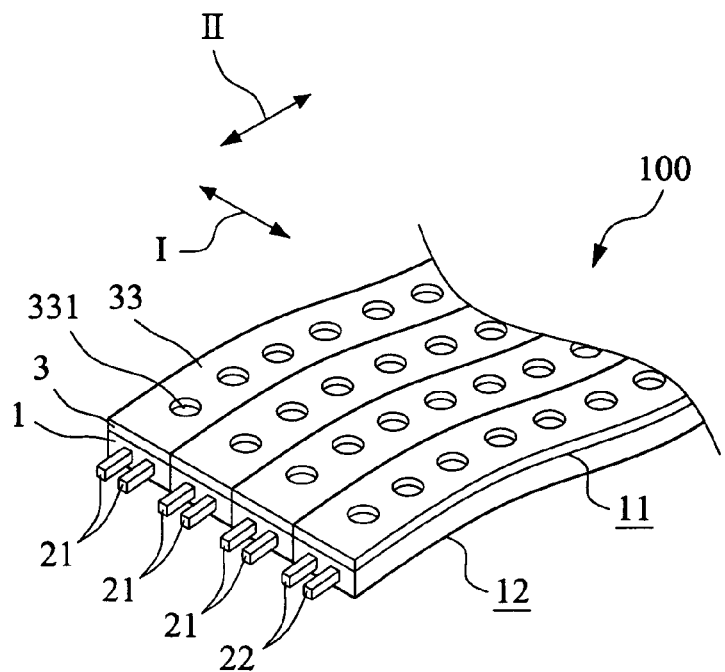
FIG. 6 is a fragmentary perspective view of a planar type flexible cable with shielding structure according to a fourth embodiment of the present invention.

FIG. 6 is a fragmentary perspective view of a planar type flexible cable with shielding structure according to a fourth embodiment of the present invention. The fourth embodiment is generally structurally similar to the first embodiment shown in FIG. 1, except that a flat layer of shielding structure 33 having a plurality of openings 331 is formed on the first (top) surface 11 of the insulated section 11. The openings 331 are arranged in an extending direction of the differential-mode signal transmission lines 21 in the insulated section 1. With the openings 331 formed on the insulated section 1 corresponding to the differential-mode signal transmission lines 21, it is possible to decrease a capacitance between the differential-mode signal transmission lines 21 and the flat layer of shielding structure 33 and thereby increases the impedance of the differential-mode signal transmission lines 21 and the flat layer of shielding structure.

Figure 7:
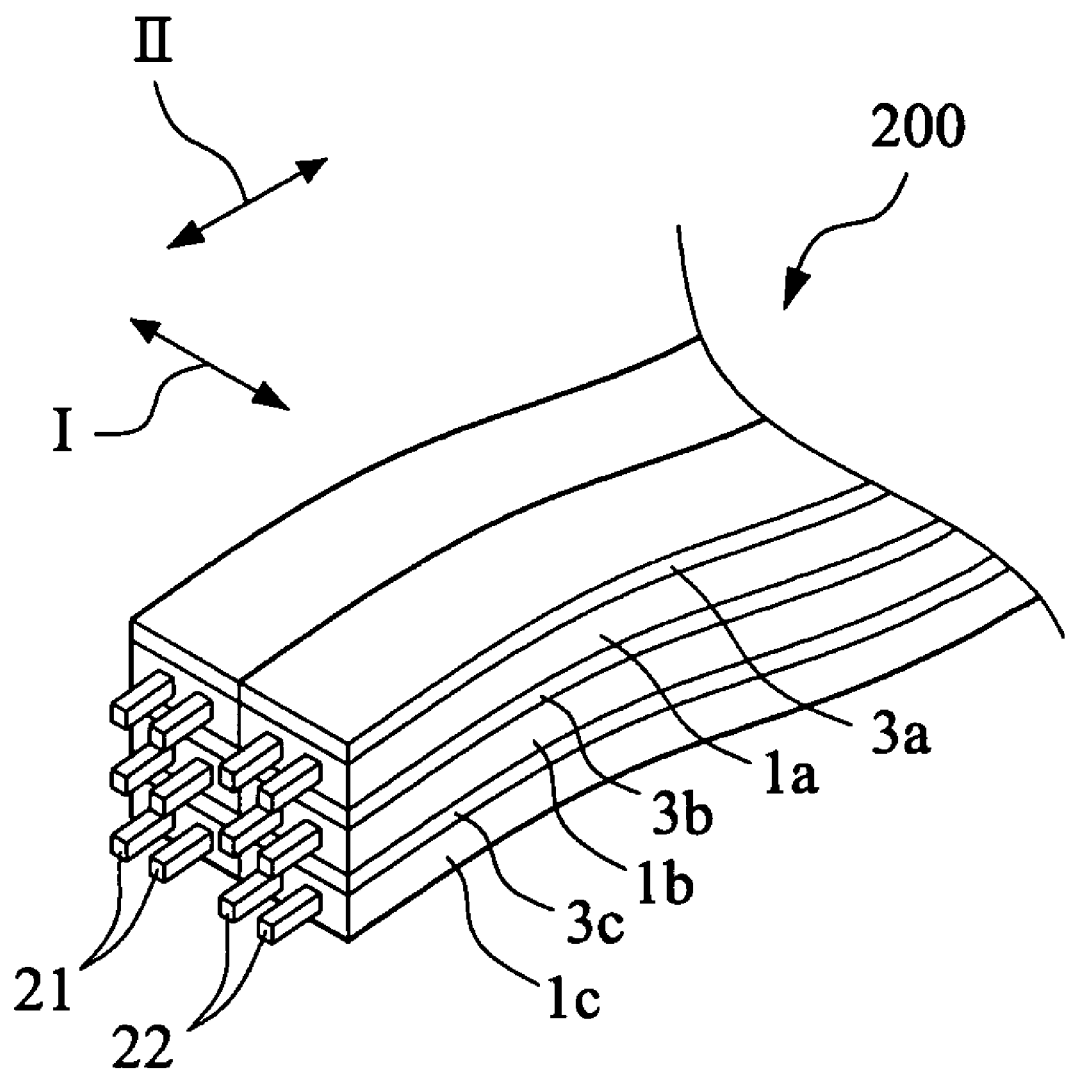
FIG. 7 is a fragmentary perspective view of a planar type flexible cable with shielding structure according to a fifth embodiment of the present invention.

FIG. 7 is a fragmentary perspective view of a planar type multi-layer flexible cable with shielding structure according to a fifth embodiment of the present invention. The planar type multi-layer flexible cable with shielding structure according to the fifth embodiment of the present invention is generally denoted by a reference numeral 200, and includes a plurality of longitudinally extended and vertically stacked insulated sections 1a, 1b, 1c. As in the above-described first embodiment, each of the stacked insulated sections 1a, 1b, 1c has at least one pair of differential-mode signal transmission lines 21 arranged therein, and the differential-mode signal transmission lines 21 in each pair are horizontally closely spaced in a transverse direction 1 and extended in an extending direction II of the insulated section.

A flat layer of shielding structure 3a, 3b, 3c is provided on a top of each insulated section 1a, 1b, 1c with a predetermined distance left between the shielding structure 3a, 3b, 3c and the differential-mode signal transmission lines 21 in the corresponding layer of insulated section 1a, 1b, 1c. The flat layers of shielding structure 3a, 3b, and 3c provide the differential-mode signal transmission lines 21 with a required impedance value.

Figure 8:
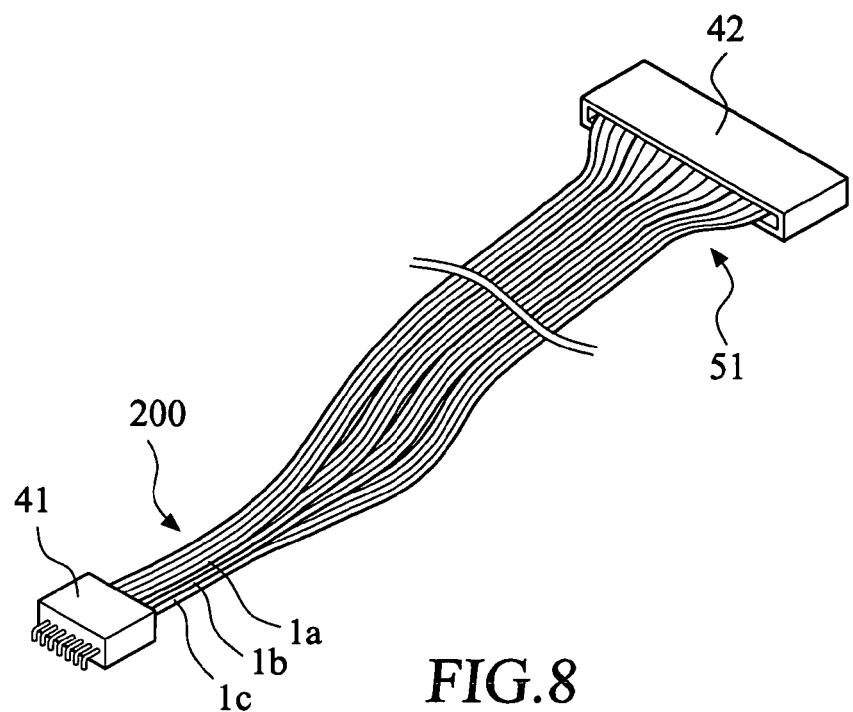
FIG. 8 shows a first example of application of the planar type flexible cable with shielding structure of FIG. 7.

Please refer to FIG. 8 that shows a first example of application of the planar type multi-layer flexible cable 200 of FIG. 7. In this example of application, the planar type multi-layer flexible cable 200 is connected at two ends to two connectors 41, 42. The stacked insulated sections 1a, 1b, 1c of the flexible cable 200 are separated and laterally spread at the same one end to form a spread zone 51, so that the differential-mode signal transmission lines 21 inside the planar type multi-layer flexible cable 200 are allowed to separately connected to signal contacts on the connectors 41, 42. It is understood the planar type multi-layer flexible cable 200 may be otherwise connected at two ends to a plurality of predetermined contacts on a connector and a circuit base board.

Figure 9:
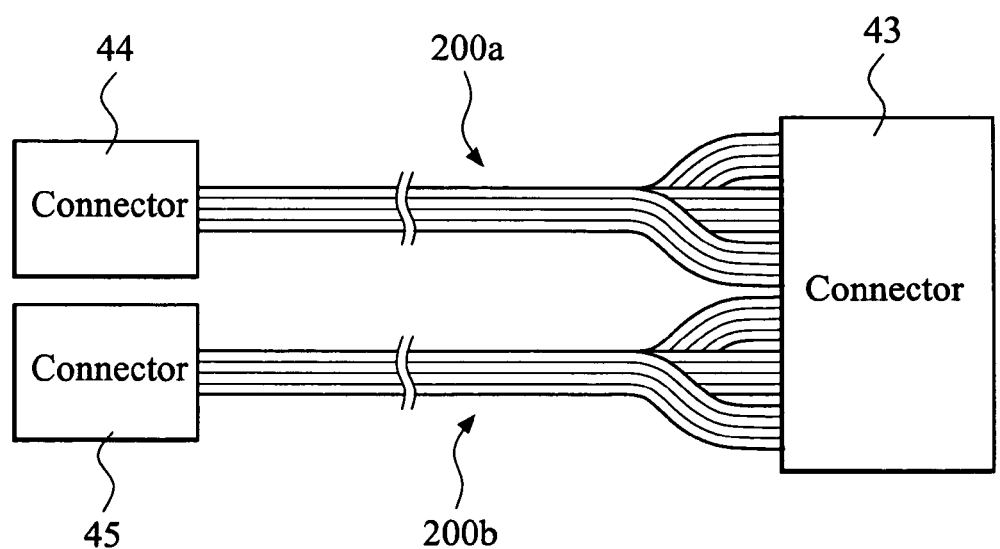
FIG. 9 shows a second example of application of the planar type flexible cable with shielding structure of FIG. 7.

FIG. 9 shows a second example of application of the planar type multi-layer flexible cable 200 of FIG. 7. In this second example of application, there are two separated planar type multi-layer flexible cables 200a, 200b being used to connect three connectors to one another. The first planar type multi-layer flexible cables 200a is connected at an end to the first connector 43, and at the other end to the second connector 44, while the second planar type multi-layer flexible cables 200b is connected at an end to the first connector 43, and at the other end to the third connector 45. Since the present invention provides a quite large flexibility in the applications thereof, a user may choose different connecting manners depending on actual need.

The present invention has been described with some preferred embodiments thereof and it is understood that many changes and modifications in the described embodiments can be carried out without departing from the scope and the spirit of the invention that is intended to be limited only by the appended claims.

What is claimed is:

1. A planar type flexible cable, comprising:
   a longitudinally extended insulated section having a top and a bottom surface and a pair of longitudinally extended and transversely spaced side surfaces, and two ends separately defining a first and a second end;
   at least one pair of differential-mode signal transmission lines, said differential-mode signal transmission lines being in one pair being horizontally closely spaced inside said insulated section in said transverse direction, and extended in said longitudinal direction of said insulated section from the first end to the second end of said insulated section; and a flat layer of shielding structure provided on at least one of said top and bottom surfaces of said insulated section with a predetermined distance left between said shielding structure and said differential-mode signal transmission lines inside said insulated section, said side surfaces of said insulated section being devoid of said flat layer of shielding structure, and said flat layer of shielding structure providing an impedance value needed by said differential-mode signal transmission lines, said flat layer of shielding structure being a flat layer of net-type shielding structure.

2. The planar type flexible cable as claimed in claim 1, wherein said insulated section is further provided with at least one pair of common-mode signal transmission lines, in addition to said at least one pair of differential-mode signal transmission lines.

3. A planar type flexible cable, comprising:

a plurality of longitudinally extended and vertically stacked insulated sections, each of which has a top and a bottom surface, and two ends separately defining a first and a second end;

at least one pair of differential-mode signal transmission lines arranged in each of said insulated sections, said differential-mode signal transmission lines in one pair being horizontally closely spaced inside said insulated section in a transverse direction, and extended in said longitudinal direction of said insulated section from the first end to the second end of said insulated section; and a plurality of flat layers of shielding structure, each of which is provided on only said top surface of a respective one of said insulated sections with a predetermined distance left between said shielding structure and said differential-mode signal transmission lines inside said respective insulated section and a portion of said plurality of flat layers of shielding structure being sandwiched between two adjacent insulated sections, and said plurality of flat layers of shielding structure providing an impedance value needed by said differential-mode signal transmission lines.

4. The planar type flexible cable as claimed in claim 3, wherein each said flat layer of shielding structure is a flat layer of net-type shielding structure.

5. The planar type flexible cable as claimed in claim 3, wherein each said flat layer of shielding structure is provided with a plurality of openings arranged in said longitudinal direction of said differential-mode signal transmission lines inside said insulated section for reducing a capacitance between said differential-mode signal transmission lines and a corresponding one of said flat layers of shielding structure.

6. The planar type flexible cable as claimed in claim 3, wherein each insulated section is further provided with at least one pair of common-mode signal transmission lines, in addition to said at least one pair of differential-mode signal transmission lines.

* * * * *